(12) United States Patent
Easwaran et al.

(10) Patent No.: US 7,429,895 B2
(45) Date of Patent: Sep. 30, 2008

(54) SYSTEMS AND METHODS FOR DRIFT COMPENSATION IN A CONTROL CIRCUIT

(75) Inventors: Prakash Easwaran, Bangalore (IN); Anant Shankar Kamath, Bangalore (IN); Rupak Ghayal, Bangalore (IN); Birman Chattopadhyay, Bangalore (IN); Gopal Krishna Nayak, Karnataka (IN); Sameer Raghavendra Joshi, Bangalore (IN); Mithun Guddethota Neelakant, Karnataka (IN); Subhash Yekanath Pai, Mangalore (IN); Shivaprakash Halagur, Bangalore (IN)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 11/366,006

(22) Filed: Feb. 28, 2006

(65) Prior Publication Data

US 2007/0205834 A1    Sep. 6, 2007

(51) Int. Cl.
*H03L 7/00* (2006.01)
(52) U.S. Cl. .............................. 331/16; 331/176; 331/34
(58) Field of Classification Search ................. 331/176, 331/16, 34
See application file for complete search history.

(56) References Cited

U.S. PATENT DOCUMENTS 6,686,804 B1 *   2/2004   Adams et al. .................. 331/17

\* cited by examiner

*Primary Examiner*—Arnold Kinkead
(74) *Attorney, Agent, or Firm*—Ronald O. Neerings; Wade J. Brady, III; Frederick J. Telecky, Jr.

(57) ABSTRACT

Various systems and methods for drift compensation are disclosed. As one example, a system for compensating drift in a control circuit is disclosed that includes at least two control signals. One of the control signals is provided by a circuit that is susceptible to drift. This control signal is provided both to a systems or device under control, and to a detection circuit. The detection circuit is operable to detect a drift in the control signal. In addition, the detection circuit provides another control signal that varies as a function of the drift in the received control signal.

20 Claims, 4 Drawing Sheets

SYSTEMS AND METHODS FOR DRIFT COMPENSATION IN A CONTROL CIRCUIT

BACKGROUND OF THE INVENTION

The present invention is related to control systems, and in particular to systems and methods for drift compensation in control circuits.

Figure 1:
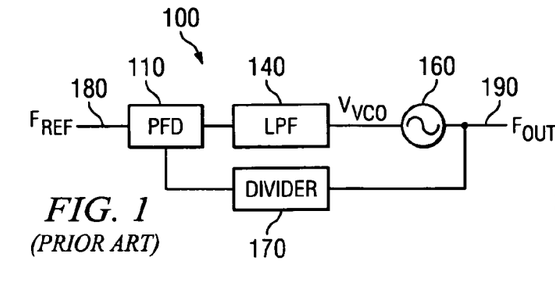
FIG. 1 is a conventional phase lock loop circuit.

Electronic control circuits are used in many applications from motor controllers to frequency synthesizers. As just one example, phase lock loop circuits are used in many applications as frequency synthesizers to generate a precise frequency signal. An exemplary basic phase lock loop circuit is shown in FIG. 1, and may be used to manage clock frequency and phase. Turning to FIG. 1, a basic phase lock loop circuit 100 is shown that includes a phase/frequency detector 110, a loop filter 140 typically comprising some RC components, a voltage controlled oscillator 160, and a frequency divider 170. In operation, a reference frequency 180 is compared with a divided feedback of an output frequency 190, and the comparison is used to drive voltage controlled oscillator 160 to form output frequency 190 consistent with reference frequency 180. Where frequency divider 170 causes a division by 'N', phase lock loop circuit 100 forces output frequency 190 to be exactly N times reference frequency 180. Phase/frequency detector 110 delivers either positive or negative charge pulses to voltage controlled oscillator 160 depending upon whether the phase of output frequency 180 leads or lags reference frequency 190. The delivered charge pulses are integrated by loop filter 140 to generate a control voltage ($V_{VCO}$) that is applied to voltage controlled oscillator 160 causing the frequency to increase or decrease. As will be appreciated from the preceding description, output frequency 190 may be adjusted by changing either or both of reference frequency 180 or the value of frequency divider 170.

Figure 2:
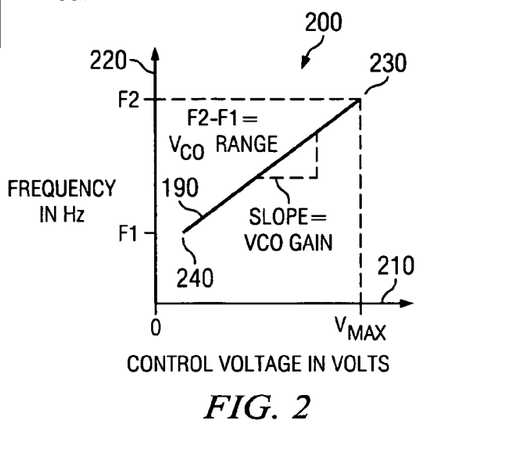
FIG. 2 is a graphical diagram showing operation of the phase lock loop circuit of FIG. 1.

For the purposes of this discussion, the operation of voltage controlled oscillator 160 is assumed to be linear as shown in FIG. 2. In particular, FIG. 2 shows a graph 200 with output frequency 190 plotted as a function of the control voltage applied to voltage controlled oscillator 160. A Y-Axis 220 represents frequency, and an X-Axis 210 represents voltage. The range of the control voltage is typically limited by an available power supply on an upper end 230 and by the control of the locking mechanism on a lower end 240, and this leads to a finite range between an upper or maximum frequency available and a lower or minimum frequency available. In some cases, it may-be that drift due to factors such as temperature, limits an effective frequency range of phase lock loop circuit 100. These same limitations affect the control of circuits other than phase lock loop circuits.

Hence, for at least the aforementioned reasons, there exists a need in the art for advanced systems and methods for drift compensation in a control circuit.

BRIEF SUMMARY OF THE INVENTION

The present invention is related to control systems, and in particular to systems and methods for drift compensation in control circuits.

Various embodiments of the present invention provide systems for drift compensatioin in a control circuit. Such embodiments include a control signal that is provided by a circuit that is susceptible to drift. Such drift may be caused by, for example, temperature change in the circuit. Where the circuit includes a voltage controlled oscillator, the drift may be caused by a temperature change affecting the output of the voltage controlled oscillator. The control signal is provided to a detection circuit that is operable to detect drift in the control signal, and to provide an additional control signal that varies as a function of any detected drift.

In some cases, the systems may include a voltage controlled oscillator that provides an output frequency based at least in part on both the control signal provided to the detection system and the control signal provided by the detection system. In some instances, the control signal is provided to the voltage controlled oscillator via a very low pass filter. Thus, while the control signal may be incremented or decremented in relatively large steps, the signal received by the voltage controlled oscillator is smooth. By smoothing the signal, abrupt changes in the operation of the voltage controlled oscialltor may be eliminated. This allows for a reduction in frequncy error/jitter at the output of thea pase lock loop. In some instances, the two control signals are combined into a single signal that is applied to the voltage controlled oscillator, while in other cases, the two control signals are applied to two respective inputs of the voltage controlled oscillator. In some cases, one of the control signals is intended to correct fast changes in circuit operating conditions such as, for example, random noise. The other control signal is intended to apply an occasional stpe change to compensate for slow moving shcanges such as, for example, temperature drift. It may be desirable to limit the application of this latter control signal so that the operational integrity of the circuit is maintained. Thus, in some cases, a very low pass filtering is applied to the latter control signal. In some cases, the detection circuit is implemented at least partially in the digital domain, and the voltage controlled oscillator is implemented in the analog domain. In such a case, the control signal provided to the detection circuit may be provided in the digital domain, and to the voltage controlled oscillator in the analog domain.

In one particular case, the control signal provided to the detection circuit is a fine control signal, and the system further includes a coarse control signal. In such a case, the control signal provided by the detection circuit may be operable to maintain a particular operation within a range indicated by the fine control signal. For example, in such a case the system may include a voltage controlled oscillator that provides an output frequecy based at least on the fine control signal, the coarse control signal, and the control signal provided by the detection circuit.

In various cases of the embodiments, the systems further include a motor controller that provides a motor control output based at least in part on both the control signal provided to the detection circuit, and the control signal provided by the detection circuit. The motor controller is operable to maintain a motor associated with the motor controller within a range indicated by the control signal provided to the detection circuit.

Other embodiments of the present invention provide methods for drift compensation. Such methods include providing a control circuit. The control circuit outputs a control signal that is susceptible to temperature drift. The methods further include monitoring the control signal provided by the control circuit such that the temperature drift may be detected. The methods also include providing another control signal that is proportional to or varies as a function of the variance associated with the temperature drift.

Yet other embodiments of the present invention provide phase lock loop circuits. Such phase lock loop circuits include a detection circuit that receives a control signal that is susceptible to some form of drift, and provides a compensating control signal that varies as a function of and/or in proportion to the drift. The phase lock loop circuits further include a controlled oscillator that is electrically coupled to both the control signal provided to the detection circuit, and to the compensating control signal.

This summary provides only a general outline of some embodiments according to the present invention. Many other objects, features, advantages and other embodiments of the present invention will become more fully apparent from the following detailed description, the appended claims and the accompanying drawings.

BRIEF DESCRIPTION OF THE DRAWINGS

A further understanding of the various embodiments of the present invention may be realized by reference to the figures which are described in remaining portions of the specification. In the figures, like reference numerals are used throughout several to refer to similar components. In some instances, a sub-label consisting of a lower case letter is associated with a reference numeral to denote one of multiple similar components. When reference is made to a reference numeral without specification to an existing sub-label, it is intended to refer to all such multiple similar components.

DETAILED DESCRIPTION OF THE INVENTION

The present invention is related to control systems, and in particular to systems and methods for drift compensation in control circuits.

Various embodiments of the present invention provide for drift compensation that can be performed in relation to one or both of an analog phase lock loop or a digital phase lock loop system. In the case of an analog phase lock loop system, a drift compensation circuit may be included to allow for a reduced control range and a correspondingly reduced controlled oscillator range. Similarly, in the case of a digital phase lock loop system, a drift compensation element formed of software or hard-coded gates may be included to allow for a reduced fine control range and a correspondingly reduced controlled oscillator range.

Various embodiments of the present invention provide systems for drift compensation in a control circuit. Such drift may be, for example, a change in circuit operation that occurrs because of a change in an operating temperature of the circuit. In many cases, electrical components have an associated temperature coefficient that can be used to calculate an operational change for the component across a range of temperatures. Such a change in operation as temperature is increased or decreased is generically referred to as "temperature drift". Some circuits may be affected by variables in addition to or other than temperature changes. Changes in circuit operation due to any variable including temperature is generically referred to herein as "drift". In particular, as used herein, the term "drift" is used in its broadest sense to mean any modification in circuit operation due to one or more variables that occurs slowly relative to the bandwidth of a given circuit. Thus, for example, changes due to temperature would be included in a drift, but changes due to a spike in a power supply or high frequency noise in a circuit may be excluded.

Such embodiments may include a control signal that is provided by a circuit that is susceptible to drift. As just one example, the circuit may include a voltage controlled oscillator that is susceptible to drift induced by a change in temperature, and in this case the control signal may be derived based on an output from the voltage controlled oscillator and the derived signal provided as feedback to the same voltage controlled oscillator. In other cases, the control signal may be, for example, the output signal from the voltage controlled oscillator. In such cases, the control signal may be provided to a detection circuit that is operable to detect drift exhibited by the control signal, and to provide an additional control signal that varies as a function of a detected drift. As used herein, the phrase "as a function of" is used in its broadest sense to mean any relationship between an input and an output. Thus, the phrase implies that any function may relate an output to an input including, but not limited to, a step function, a smooth function, and/or some combination thereof. Based on the disclosure provided herein, one of ordinary skill in the art will recognize a variety of functions that may be used to relate outputs to inputs in accordance with various embodiments of the present invention. Further, as used herein, the phrase "detection circuit" is used in its broadest sense to mean any circuit, device or system that is capabile of detecting a drift associated with the received control signal, and providing some output associated with that drift.

In some cases, the systems may include a controlled oscillator that provides an output frequency based at least in part on both the control signal provided to the detection system and the control signal provided by the detection system. As used herein, the phrase "controlled oscillator" is used in its broadest sense to mean any circuit, device and/or system capable of providing an oscillating output where some aspect of the oscillating output is controllable via an input. Thus, a controlled oscillator may be, but is not limited to, a voltage controlled oscillator. Such voltage controlled oscillators are generally known in the art, and provide a clock output at a frequency that is governed by a voltage input. Based on the disclosure provided herein, one of ordinary skill in the art will recognize a variety of controlled oscillators that may be used in accordance with one or more embodiments of the present invention. Some embodiments described herein are described using a voltage controlled oscillator, however, it should be noted that in one or more cases it may be possible to utilize another type of controlled oscillator such as, for example, a current controlled oscillator. In some instances, the two control signals are combined into a single signal that is applied to the controlled oscillator, while in other cases, the two control signals are applied to two respective inputs of the controlled oscillator. In some cases, the detection circuit is implemented at least partially in the digital domain, and the controlled oscillator is implemented in the analog domain. In such a case, the control signal provided to the detection circuit may be provided in the digital domain, and to the controlled oscillator in the analog domain.

In one particular case, the control signal provided to the detection circuit is a fine control signal, and the system further includes a coarse control signal. As used herein, the phrases "fine control signal" and "coarse control signal" are used in their broadest senses to mean any control signals that provide for a different range of control relative to one another. Thus, as just one of many examples, a coarse control signal may be operable to select a broad operational range and the fine control signal may be operable to select a portion of the broad operational range. In some embodiments of the present invention, a phase lock loop circuit may be defined that includes a controlled oscillator that provides an output frequency based on a fine control signal, a coarse control signal, and a compensating control signal (i.e., a control signal provided by the detection circuit).

In various cases of the embodiments, the systems may include a motor controller that provides a motor control output based at least in part on both the control signal provided to the detection circuit, and the control signal provided by the detection circuit. The motor controller is operable to maintain a motor associated with the motor controller within a range indicated by the control signal provided to the detection circuit. As used herein, the term "motor" is used in its broadest sense to mean any device, circuit, or system capable of causing physical movement. Also, a motor controller may be any device, circuit or system capable of providing control to a motor. In some cases, motors are available with integrated motor controllers. Such an integrated motor and motor controller obviously includes both a motor and a motor controller.

A typical phase lock loop circuit requires a voltage controlled oscillator with a broad operating range, and relies upon the voltage controlled oscillator to compensate for any detected drift. In contrast, various embodiments of the present invention provide for drift compensation in a phase lock loop circuit apart from the compensation control offered by a voltage controlled oscillator. This allows for the implementation of phase lock loop circuits using voltage controlled oscillators with reduced operating range and reduced gain. Based on the disclosure provided herein, one of ordinary skill in the art will appreciate a variety of advantages achievable through use of such embodiments. As just some advantages, the reduced operating range and reduced gain simplifies design of an analog phase lock loop circuit, and improves accuracy in a digital phase lock loop circuit.

In particular, some embodiments of the present invention include a coarse control capable of compensating for process variations, operating temperature and desired output frequency. In addition, a fine control is provided to make more limited compensation adjustments. The coarse control is generally set at start up, and the fine control is adjusted continuously during circuit operation to adjust for changes that occur over time as the circuit is operated. In a typical phase lock loop implementation, the fine control must provide for a sufficiently broad range of adjustment to allow it to compensate for drift occurs due to, for example, changes in circuit temperature. This broad operational range limits any possible reduction in voltage controlled oscillator operational range. Hence, embodiments of the present invention provide an additional drift compensation circuit that allows for a smaller fine control range, and thus a smaller voltage controlled oscillator operational range.

In some cases, the drift compensation includes a control signal that is applied to the voltage controlled oscillator as a step change whenever a correctable drift is detected. Such a step change may create an abrupt and undesirable change in the frequency output of the voltage controlled oscillator. Thus, in some cases, the control signal from the drift compensation circuitry may be provided to the voltage controlled oscillator via a very low pass filter. The very low pass filter operates to smooth the otherwise abrupt step change in the control signal. The amount of smoothing (i.e., the design of the very low pass filter) is selected to keep the error at the output of the voltage controlled oscillator within an acceptable range. Determining the bandwidth of the very low pass filter may include considering one or more of (1) the size of the step being applied by the control signal, (2) the bandwidth of the phase lock loop circuit being corrected, and (3) the frequency error tolerable at the output of the voltage controlled oscillator. Thus, for example, where the tolerable frequency error is high, the bandwidth of the very low pass filter may also be high for a reasonable step value and phase lock loop bandwidth. Alternatively, where the bandwidth of the phase lock loop circuit is very low and the step value is substantial, the bandwidth of the very low pass filter should be very low. Based on the disclosure provided herein, one of ordinary skill in the art will recognize a variety of designs for a very low pass filter that would satisfy the purposes of the very low pass filter for a given circuit.

Figure 3A:
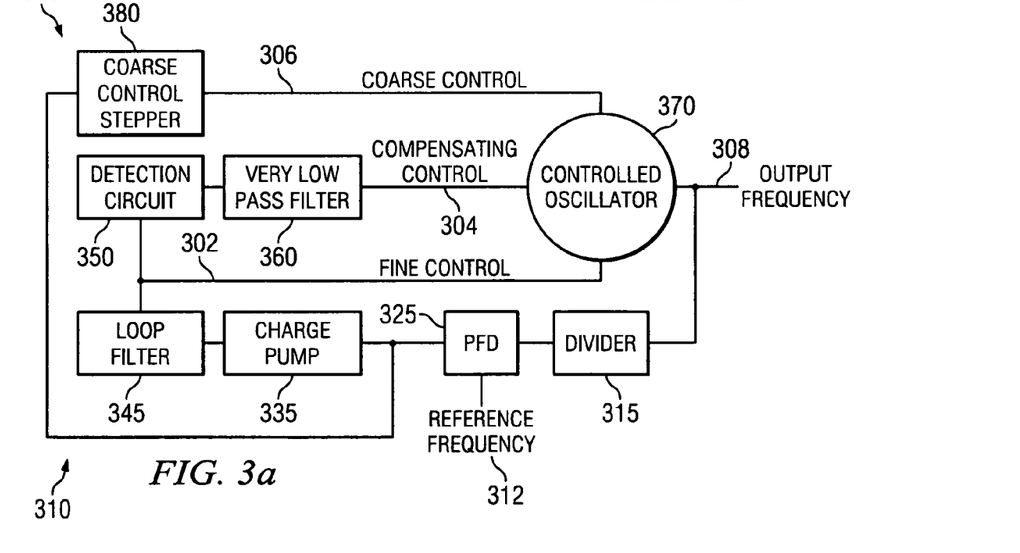
FIG. 3a is an analog phase lock loop system in accordance with various embodiments of the present invention.

Turning to FIG. 3a, a phase lock loop system 300 is depicted that utilizes a system for compensating drift in accordance with one or more embodiments of the present invention. Phase lock loop system 300 includes a control circuit 310 that includes a divider 315, a phase/frequency detector 325, a charge pump 335, and a loop filter 345. Control circuit 310 provides a fine control 302 based on a reference frequency 312 and an output frequency 308. Fine control 302 drives a controlled oscillator 370 and an analog detection circuit 350. Analog detection circuit 350 provides a compensating control 304 to controlled oscillator 370 via a very low pass filter 304. Controlled oscillator 370 is also driven by a coarse control 306 provided by a coarse control stepper circuit 380.

In general, phase lock loop system 300 compares reference frequency 312 with a divided derivative of output frequency 308 to determine whether output frequency 308 is too high or too low. The comparison between the two frequencies is used to drive controlled oscillator 370 to form output frequency 308 consistent with reference frequency 312. In particular, an analog voltage is provided by phase frequency detector 325 that indicates whether output frequency 308 is too high or too low. This analog voltage drives charge pump 335 which provides a current via loop filter 345 to a control input of controlled oscillator 370.

In addition, coarse control 306 is provided to controlled oscillator 370 via coarse controlled stepper 380. The voltage to frequency gain exhibited by coarse control 306 is relatively large. As such, coarse control 306 controls the overall range at which controlled oscillator 370 operates. In a typical operation, when phase lock loop system 300 first starts, charge pump 335 is driven by phase/frequency detector 325 such that fine control 302 is maintained fixed half way between its upper and lower limits. Thus, for example, fine control 302 may be maintained at a zero voltage. At the same time, phase/frequency detector 325 drives coarse control stepper 380 with a voltage indicative of a difference between reference frequency 312 and output frequency 308. The applied voltage causes coarse control stepper 380 to make incremental steps in coarse control 306. Such incremental steps in coarse control 306 result in substantial changes to output frequency 308.

Once output frequency 308 is within a range of reference frequency 312 that can be compensated by fine control 302, coarse stepper control 380 is fixed, and coarse control 306 is maintained substantially constant. At this point, phase frequency detector 325 drives charge pump 335 with a voltage indicative of a difference between output frequency 308 and reference frequency 312. Charge pump 335 drives a continuous signal via loop filter 345 to provide fine control 302 to controlled oscillator 370. Fine control 302 is applied to controlled oscillator 370 to force output frequency 308 to a value indicated by reference frequency 312. The final output value is within the range of the discrete step of coarse control stepper 380.

As such, a combination of coarse control 306 and fine control 302 govern the range of operation of controlled oscillator 370 with coarse control 306 fixing a broad operating range of controlled oscillator 370, and fine control 302 fixing output frequency 308 within the operation range to match the value indicated by reference frequency 312. Such an approach effectively provides a coarse lock and a fine lock for phase lock loop system 300. When the coarse lock is fixed, the gain of controllable oscillator 370 is only that provided by fine control 302. Thus, the gain of phase lock loop system 300 can be dramatically reduced, while at the same time offering a broad operating range. This general approach for coarse and fine locking is known in the art and may be utilized to provide a phase lock loop system capable of providing a broad operational range without requiring a correspondingly large controlled oscillator gain. This allows for a decrease in the size of loop filter 345, and reduces reference frequency spurs occurring at output frequency 308.

Phase lock loop system 300 is further augmented with analog detection circuit 350 and a very low pass filter 360 that may be used to form a compensating control 304. In particular embodiments of the present invention, fine control 302 may operate in a range that is not sufficiently large to compensate for drift exhibited by one or more components used to form controlled oscillator 370, divider 315, phase frequency detector 325, charge pump 335, and/or loop filter 345. Indeed, fine control may be purposely designed to operate in a narrow range as this allows for controlled oscillator 370 to operate over a more limited range. Such drift may be caused by a change in operating temperature of the components, and/or by other factors. Depending on process technology and the architecture of controlled oscillator 370, the temperature variation of controlled oscillator 370 can result in a relatively large output frequency range. In some cases, this drift may be sufficient to cause phase lock loop system 300 to move out of the range controllable by fine control 302. Compensating control 304 is provided to avoid the situation where drift causes the desired frequency to move beyond the range controlled by fine control 302, and to retain operation of phase lock loop system 300 within the range. Thus, analog detection circuit 350 and very low pass filter 360 may be any combination of systems, components and/or devices that are capable of providing an offset voltage or current that varies in proportion to the drift of fine control 302 and/or coarse control 306.

In one particular case, very low pass filter 360 is a simple R-C filter that utilizes resistor and capacitor values that are sufficiently large to create the desired filter characteristic. Such filters are known in the art and have been used, for example, to filter noise from a bandgap reference voltage. In such an example, the resistor is typically implemented as a MOS transistor in linear region as is known in the art. In contrast to the way earlier filters have been used, various embodiments of the present invention are used to apply a signal over an extended time period, rather than to reduce or eliminate a signal classified as noise.

In operation, a desired frequency for phase lock loop system 300 is selected by applying an appropriate reference frequency 312. Coarse control stepper 380 adjusts coarse control 306 until a coarse lock is achieved. This coarse lock effectively consists of selecting one of a number of operation ranges on which the desired frequency is located. Then, fine control 302 is adjusted such that the output frequency moves along the selected operation range until the desired frequency is achieved. As the circuit is operated, drift occurs due to, for example, changes in temperature. When this drift is detected by analog detection circuit 350, analog detection circuit 350 provides an output that is incremented or decremented by a step value. The step value is in an opposite direction of the drift and operates to compensate for the detected drift. The step output is provided to very low pass filter 360 that operates to extend the step value over time, and thus provide compensating control signal 304 as a smooth signal. This avoids the impact of providing an abruptly changing step signal to controlled oscillator, and allows for a reduction in frequency error/jitter at the output of a phase locked loop.

Figure 3B:
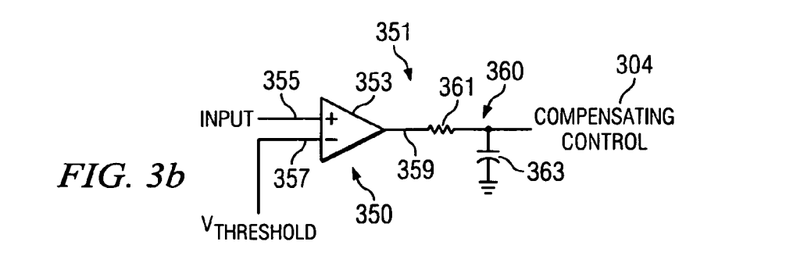
FIG. 3b is an analog detection circuit that may be used in relation to one or more embodiments of the present invention.

Turning to FIG. 3b, an exemplary implementation 351 of analog detection circuit 350 and very low pass filter 360 in accordance with one or more embodiments of the present invention is shown. Exemplary implementation includes a comparator 353 that receives the feedback signal from the controlled oscillator (i.e., input 355) and compares it to a threshold voltage 357 (i.e., VThreshold). Where input 355 exceeds VThreshold 357, an output 359 of comparator 353 is stepped. This step increase is applied to very low pass filter 360 which includes a resistor 361 and a capacitor 363. Stepped output 359 is smoothed by very low pass filter 360 resulting in compensating control 304. It should be noted that exemplary implementation 351 provides for a single threshold detection, and that more comparators may be used where additional thresholds are to be detected. Thus, for example, where high and low threshold values are to be detected, two comparators may be used. Where it is desired to reduce the incremental change applied to very low pass filter 360, a larger number of comparators may be used to provide for an increased number of threshold comparisons. Based on the disclosure provided herein, one of ordinary skill in the art will recognize a variety of analog detection circuits and very low pass filters that may be implemented depending upon particular design considerations.

Turning to FIG. 4, a flow diagram 900 depicts a method in accordance with one or more embodiments of the present invention for frequency drift compensation in a phase lock loop system. Flow diagram 900 is described in relation to three graphical diagrams 405, 410, 415 of FIGS. 4b through 4d further depicting operation in accordance with embodiments of the present invention. Following flow diagram 900, power is initiated to phase lock loop circuit 300 (block 905). A comparison is made between output frequency 308 and N-times the reference frequency 312 (block 910). In this case, 'N' is a multiplier selected by design. Thus, for example, where the output frequency may be 480 MHz and the reference frequency is 24 MHz, N would be twenty. At this point, it is determined whether a coarse lock has been achieved (block 915).

Figure 4A:
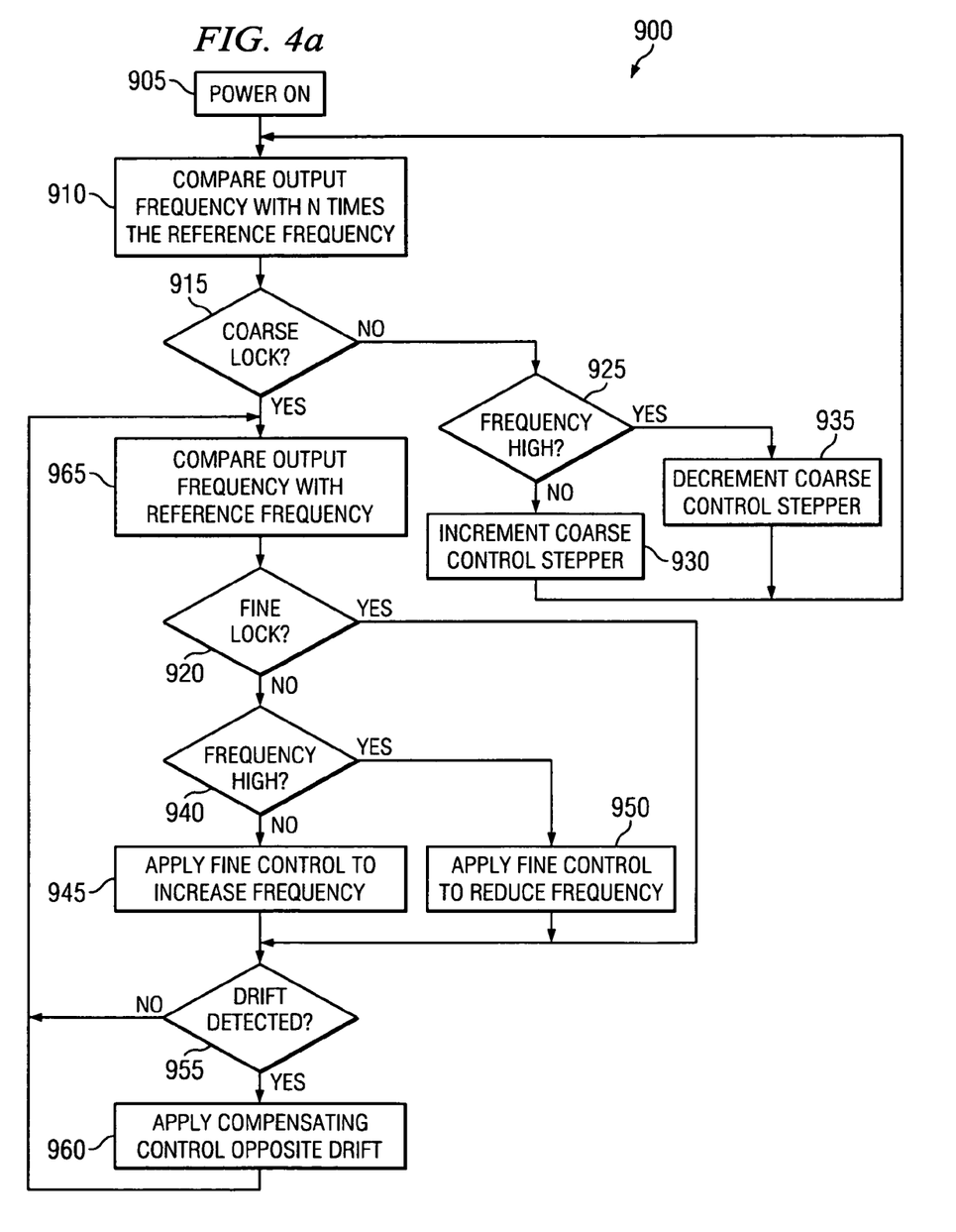
FIG. 4a is a flow diagram depicting a method in accordance with one or more embodiments of the present invention for frequency drift compensation in a phase lock loop system.

If a coarse lock has not been achieved (block 915), it is determined whether the frequency needs to be adjusted up or down to achieve a coarse lock (block 925). Where the frequency needs to be adjusted up (block 925), coarse control stepper is incremented to adjust the frequency up (block 930).

Alternatively, where the frequency needs to be adjusted down (block 925), coarse control stepper is decremented to adjust the frequency down (block 935). Incrementing or decrementing coarse control stepper 380 causes a corresponding change in coarse control 304. The loop of comparing the output frequency with the reference frequency is repeated until a coarse lock is achieved (blocks 910, 915, 925, 930, 935).

Figure 4B:
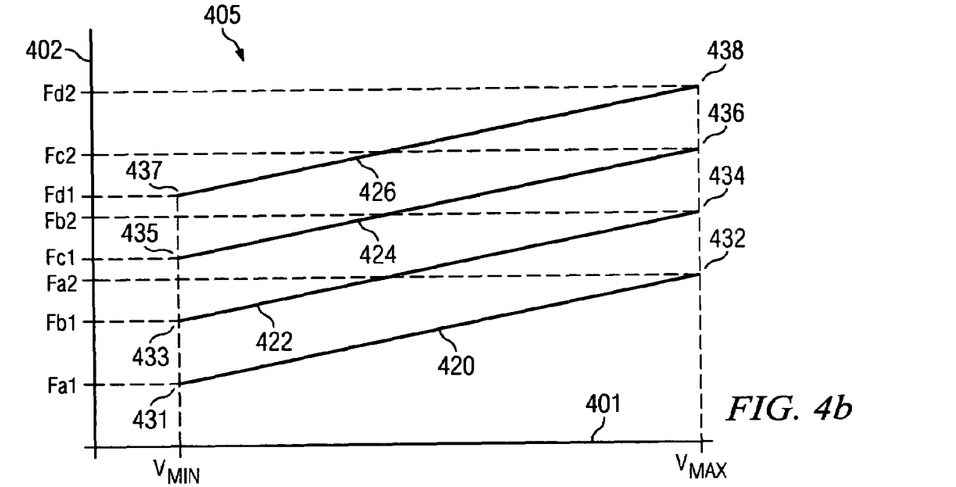
FIGS. 4b through 4d are graphical diagrams showing various operational characteristics of a system including drift compensation in accordance with some embodiments of the present invention.

The operation of coarse locking is graphically shown in graphical diagram 405 of FIG. 4b where four discrete operation ranges 420, 422, 424, 426 as a function of output frequency 308 on a vertical axis 402, and fine control 302 on a horizontal axis 401. Each of operation ranges 420, 422, 424, 426 corresponds to a respective coarse control 306. Thus, operation range 420 is available where coarse control 306 is equal to a particular voltage, and operation range 422 is available where coarse control is equal to the next voltage increment provided by coarse control stepper 380. The dashed lines are provided on graphical diagram 405 to show correspondence between frequencies and voltages of operation ranges 420, 422, 424, 426. In particular, operation range 420 operates between an output frequency of Fa1 at a point 431 where fine control 302 is at Vmin and an output frequency of Fa2 at a point 432 where fine control 302 is at Vmax. Operation range 422 operates between an output frequency of Fb1 at a point 433 where fine control 302 is at Vmin and an output frequency of Fb2 at a point 434 where fine control 302 is at Vmax. Operation range 424 operates between an output frequency of Fc1 at a point 435 where fine control 302 is at Vmin and an output frequency of Fc2 at a point 434 where fine control 302 is at Vmax. Operation range 426 operates between an output frequency of Fd1 at a point 437 where fine control 302 is at Vmin and an output frequency of Fd2 at a point 438 where fine control 302 is at Vmax.

In the example of FIG. 4b, the overall operational range of controlled oscillator is from Fa1 to Fd2, and coarse control stepper 380 is capable of four discrete steps with each step representing about one quarter of the overall range of controlled oscillator 370. Such an example would provide approximately a four fold improvement in the loop design where the overlap between operation ranges 420, 422, 424, 426 is assumed to be small. Though the total range of the controlled oscillator may be the same as a phase lock loop system that does not use coarse and fine locking, the gain of the controlled oscillator is reduced by approximately a factor of four. Based on the disclosure provided herein, one of ordinary skill in the art will recognize that more or fewer than the exemplary four discrete steps of coarse control stepper 380 may be used in accordance with different embodiments of the present invention depending upon various design constraints.

Returning to flow diagram 900, where coarse lock is achieved (block 915), a frequency comparison is performed (block 965) and it is determined whether fine lock has been achieved (block 920). If a fine lock has not been achieved (block 920), it is determined whether the frequency needs to be adjusted up or down to achieve a fine lock (block 940). Where the frequency needs to be adjusted up (block 940), control circuit 310 adjusts to increase the frequency (block 945). Alternatively, where the frequency needs to be adjusted down (block 940), control circuit 310 adjusts to decrease the frequency (block 950). The adjustments to control circuit 310 cause a corresponding change in fine control 302. Adjustment of fine control 302 causes movement along a selected one of operation ranges 420, 422, 424, 426.

It is next determined whether drift is occurring in phase lock loop system 300 (block 955). Where drift is detected (block 955), compensating control 304 is applied in the opposite direction of the drift. The loop comparing the output frequency with the reference frequency is repeated until a fine lock is achieved, and to adjust for any detected drift (blocks 920, 940, 945, 950, 955, 960, 965).

As drift occurs in phase lock loop system 300, fine control 302 automatically adjusts to compensate for the drift such that the desired output frequency is maintained. However, in many cases, the drift is so substantial that it exceeds the selected operation range. To avoid this, the operation range may be designed to account for the greatest possible drift. However, such an approach limits the ability to reduce the gain of controlled oscillator. An approach using a relatively broad operation range is shown in FIG. 4c where a desired frequency is achievable regardless of the occurring drift.

Figure 4C:
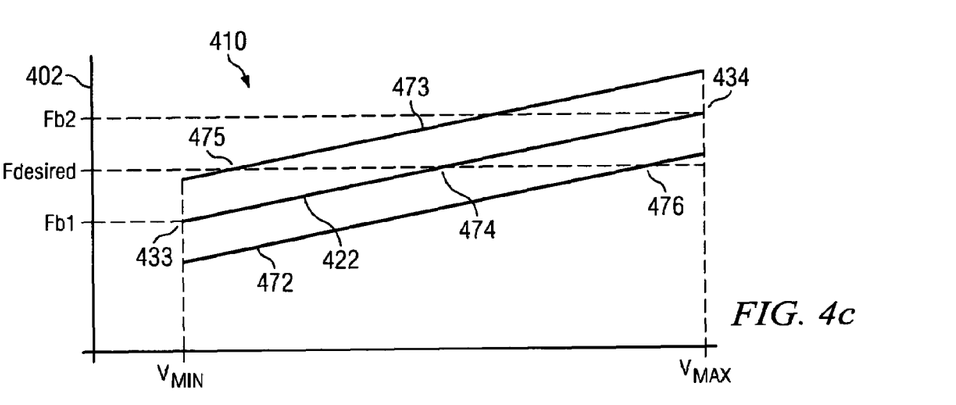

Turning to FIG. 4c, the effect of temperature drift on previously described operation range 422 is depicted in graphical diagram 410 of FIG. 4c. While not depicted, it should be noted that a similar temperature drift is also exhibited in relation to operation ranges 420, 424, 426. Also, it should be noted that while FIG. 4c is limited to temperature drift, other types of drift may also be accounted for using one or more of the embodiments of the present invention. Graphical diagram 410 shows operation range 422 bracketed by an upper operation range 473 and a lower operation range 472. Operation range 422 represents operation when phase lock loop system 300 is at a default temperature. In contrast, upper operation range 473 represents operation range 422 when phase lock loop system 300 is operated at one temperature extreme, and lower operation range 472 represents operation range 422 when phase lock loop system 300 is operated at the opposite temperature extreme.

When the circuit is operated at the default temperature, a desired frequency (i.e., Fdesired) is achieved by setting fine control 302 to a value capable of locating the frequency at a point 474 along operation range 422. In contrast, where the temperature of phase lock loop system 300 results in operation along upper operation range 473, the desired frequency is achieved by setting fine control 302 to a value capable of locating the frequency at a point 475. Where the temperature of phase lock loop system 300 results in operation along lower operation range 472, the desired frequency is achieved by setting fine control 302 to a value capable of locating the frequency at a point 476. Based on this diagram, it will be appreciated that drift compensation may be achieved by providing a relative broad operation range and corresponding controlled oscillator gain.

Figure 4D:
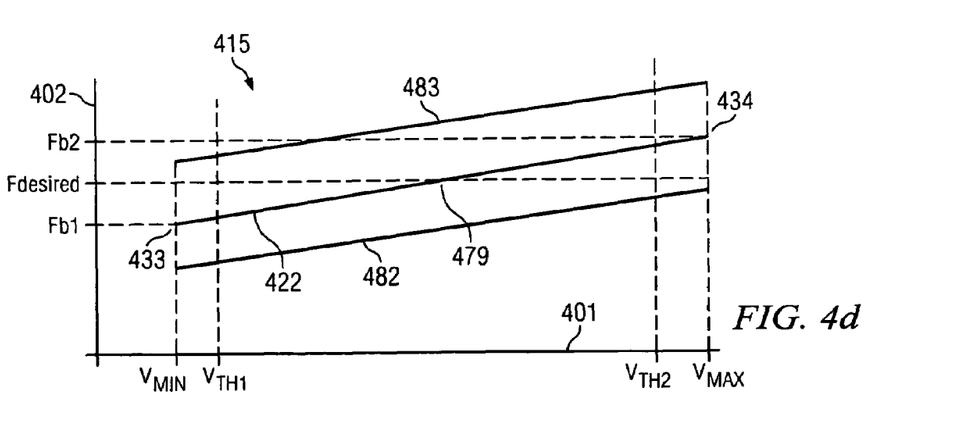

FIG. 4d shows a situation via graphical diagram 415 where the operation range and corresponding gain is limited. In particular, graphical diagram 415 shows operation range 422 bracketed by an upper operation range 483 and a lower operation range 482. Operation range 422 represents operation when phase lock loop system 300 is at a default temperature. In contrast, upper operation range 483 represents operation range 422 when phase lock loop system 300 is operated at one temperature extreme, and lower operation range 482 represents operation range 422 when phase lock loop system 300 is operated at the opposite temperature extreme. As can be seen from graphical diagram 415, there is not a point along either operation range 482 or operation range 483 where the desired frequency can be achieved. Thus, a worst case change in temperature results in a condition where phase lock loop system 300 cannot lock. This may be compensated for by incrementing or decrementing coarse control stepper 380 and re-tuning fine control 302, however, such an approach results in a substantial disruption to output frequency 308.

As an alternative, analog detection circuit 350 and very low pass filter 360 may be added to phase lock loop system 300 to provide compensating control 304. The combination of analog detection circuit 350 and very low pass filter 360 may be designed to apply very small incremental changes, or applying a large change gradually over time such that phase lock loop system 300 can react without introducing error. Using the approach of applying a large change gradually over time, compensating control 304 may be applied to force fine control 302 to remain at approximately the middle of a given operation range (e.g., operation range 422). This implies a compensating control 304 that is a smooth transitioning signal that changes very slowly and in proportion to the drift. Where compensating control 304 can change as quickly as fine control 302, it would operate to stop fine control from operating to maintain phase lock loop system 300 in lock. In contrast, where very low pass filter 360 exhibits a time constant substantially greater than the closed-loop time constant of phase lock loop system 300, fine control 302 adjusts more quickly than compensating control 304 and still operates to maintain phase lock loop system 300 in lock. As will be appreciated by one of ordinary skill in the art, the closed-loop time constant of phase lock loop system 300 depends upon the gain of the various blocks included therein. Adjusting compensating control 304 at a very slow rate when compared to fine control 302 is justifiable as temperature changes in phase lock loop system 300 occur much slower than changes in output frequency 308. This results in a very small adjustment being applied by compensating control 304. Such small adjustments should limit any frequency change exhibited in output frequency 308. As previously discussed, the magnitude of compensating control 304 may be designed in consideration of the bandwidth of phase lock loop system 300 and the frequency error that can be tolerated by an associated circuit.

As another alternative, compensating control 304 may be applied as a step function whenever fine control 302 exceeds a particular threshold value. Using such an approach, as illustrated in FIG. 4d, compensating control 304 is activated anytime analog detection circuit 350 determines that fine control 302 has exceeded either threshold Vth1 at one extreme or threshold Vth2 at the other extreme. Since temperature changes in phase lock loop system 300 are typically very slow compared to the rate at which a frequency correction can be achieved in phase lock loop system 300, output frequency 308 remains substantially constant as the correction is applied.

In such a case, compensating control 304 may exhibit several discrete values. For example, compensating control 304 may have 2n+1 discrete values: v(−n), v(−n+1), v(−n+2) ... v(−2), v(−1), v(0), v(1), v(2) ... v(n−1), v(n). Discrete value v(0) may be zero, v(n) may correspond to a upper value, and v(−n) may correspond to a lower value. Whenever threshold Vth2 is crossed, compensating control 304 is changed from v(i) to v(i+1). Similarly when Vth1 is crossed, compensating control 304 is changed from v(i) to v(i−1). Each time compensating control 304 is changed, the fine control is moved toward the center away from the corresponding threshold.

In one particular embodiment of the present invention lower threshold Vth1 is fixed half way between the center of a given operation range (e.g., operation range 422) and the lower extreme of the operation range (e.g., point 433). Upper threshold Vth2 is fixed half way between the center of the given operation range (e.g., operation range 422) and the upper extreme of the operation range (e.g., point 434). Whenever fine control 302 crosses either the upper threshold or the lower threshold, a comparator in analog detection circuit 350 is triggered, and compensating control 304 is applied. The value of compensating control 304 counteracts the drift causing fine control 302 to exceed the threshold. Through application of compensating control, phase lock loop system 300 remains locked even when temperature extremes occur. Thus, as can be appreciated from the aforementioned discussion, an occasional, gradual but open loop, correction to compensate for drift may be used in accordance with embodiments of the present invention.

Figure 5A:
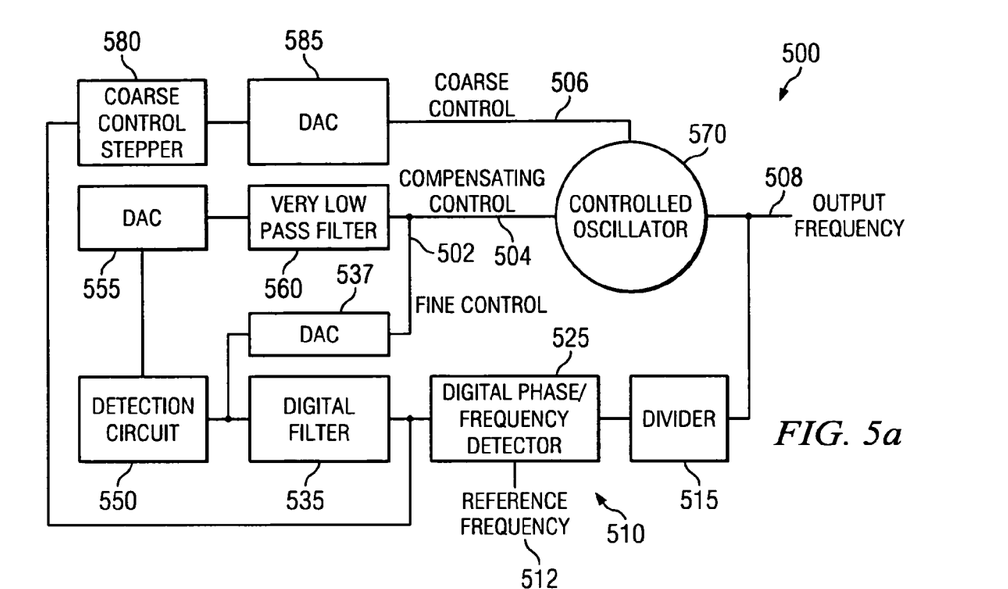
FIG. 5a is a hybrid analog/digital phase lock loop system in accordance with various embodiments of the present invention.

Turning to FIG. 5a, a phase lock loop system 500 in accordance with other embodiments of the present invention is depicted. Phase lock loop system 500 includes a control circuit 510 that includes a divider 515, a digital phase/frequency detector 525, a digital filter 535, and a digital to analog converter 537. Control circuit 510 provides a fine control 502 based on a reference frequency 512 and an output frequency 508. Fine control 502 drives a controlled oscillator 570 and a digital detection circuit 550. Digital detection circuit 550 provides a compensating control 504 to controlled oscillator 570 via a very low pass filter 504. Controlled oscillator 570 is also driven by a coarse control 506 provided by a coarse control stepper circuit 580 driving a digital to analog converter 585. Controlled oscillator 570 may be, but is not limited to, an LC tank loaded with three sets of capacitor banks, or a current starved ring oscillator supplied by three different voltage to current converters (or in a Digital application by three different current steering DACs). Based on the disclosure provided herein, one of ordinary skill in the art will recognize a variety of controlled oscillators that may be used in accordance with one or more embodiments of the present invention.

In general, phase lock loop system 500 compares reference frequency 512 with a divided derivative of output frequency 508 to determine whether output frequency 508 is too high or too low. The comparison between the two frequencies is used to drive controlled oscillator 570 to form output frequency 508 consistent with reference frequency 512. In particular, a digital value is provided by digital phase/frequency detector 525 that indicates whether output frequency 308 is too high or too low, and the magnitude of the error. This digital value is filtered by digital filter 535, and the filtered version of the digital value is converted to fine control 502 in the analog domain by digital to analog converter 537.

In addition, coarse control 506 is provided to controlled oscillator 370 in the analog domain. Coarse control 506 controls the overall range at which controlled oscillator 570 operates. In a typical operation, when phase lock loop system 500 first starts, digital phase/frequency detector 525 drives digital to analog converter 537 such that fine control 502 is maintained fixed half way between its upper and lower limits. Thus, for example, fine control 502 may be maintained at a zero voltage. At the same time, digital phase/frequency detector 525 drives coarse control stepper 580 with a digital value indicative of a difference between reference frequency 512 and output frequency 508. The digital value causes coarse control stepper 580 to make incremental steps in coarse control 506. Such incremental steps in coarse control 506 result in substantial changes to output frequency 508. Once output frequency 508 is within a range of reference frequency 512 that can be compensated by fine control 502, coarse stepper control 580 is fixed, and coarse control 506 is maintained substantially constant. At this point, digital phase/frequency detector 525 drives digital to analog converter 537 via digital filter 535 with a digital value indicative of a difference between output frequency 508 and reference frequency 512. In response, digital to analog converter 537 drives fine control 502 to controlled oscillator 570. As applied to controlled oscillator 570, fine control 502 forces output frequency 508 to a value indicated by reference frequency 512. The final output value is within the range of the discrete step of coarse control stepper 580.

A combination of coarse control 506 and fine control 502 govern the range of operation of controlled oscillator 570 with coarse control 506 fixing a broad operating range of controlled oscillator 570, and fine control 502 fixing output frequency 508 within the operation range to match the value indicated by reference frequency 512. Such an approach effectively provides a coarse lock and a fine lock for phase lock loop system 500. When the coarse lock is fixed, the gain of controllable oscillator 570 is limited to that provided by fine control 502. Thus, the gain of phase lock loop system 500 can be dramatically reduced, while at the same time offering a broad operating range. This general approach for coarse and fine locking is known in the art and may be utilized to provide a phase lock loop system capable of providing a broad operational range with a relatively small resolution without requiring a large number of bits. In particular, where coarse control 506 is not provided, the resolution of phase lock loop system 500 is equivalent to the resolution of fine control 502 (i.e., typically the resolution of digital to analog converter 537), and the range of phase lock loop system 500 is equal to the range of fine control 502. In contrast, where coarse control 506 is provided, the resolution of phase lock loop system 500 is approximately equivalent to the resolution of digital to analog converter 537, and the range of phase lock loop system 500 is equivalent to the range of digital to analog converter 537 multiplied by the number of steps provided by coarse control stepper 580. Thus, a large operational range may be achieved with a very high resolution without increasing the range of digital to analog converter 537.

In some embodiments of the present invention, phase lock loop system 500 is further augmented with a digital detection circuit 550 and a very low pass filter 560 that may be used to form a compensating control 504. In particular embodiments of the present invention, fine control 502 may operate in a range that is not sufficiently large to compensate for drift exhibited by one or more components used to form controlled oscillator 570, divider 515, digital phase/frequency detector 525, digital filter 535 and/or digital to analog converter 537. Depending on process technology and the architecture of controlled oscillator 370, the temperature variation of controlled oscillator 370 can result in a relatively large output frequency range. In some cases it might cause the range of the fine DAC to be so large that the resulting increase in the Fine Range takes away all the advantages of doing a coarse and a fine lock. In some cases, this drift may be sufficient to cause phase lock loop system 500 to move out of the range controllable by fine control 502. Compensating control 504 is provided to avoid the situation where drift causes the desired frequency to move beyond the range controlled by fine control 502, and to retain operation of phase lock loop system 500 within the range. Thus, digital detection circuit 550 and very low pass filter 560 may be any combination of systems, components and/or devices that are capable of providing an offset voltage or current that varies in proportion to the drift of fine control 502 and/or coarse control 506.

Figure 5B:
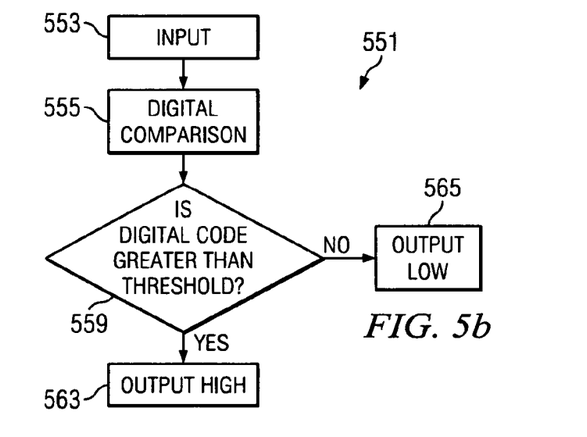
FIG. 5b is a digital detection circuit that may be used in relation to one or more embodiments of the present invention.

Turning to FIG. 5b, an exemplary implementation 551 of digital detection circuit 550 in accordance with one or more embodiments of the present invention is shown. Exemplary implementation 551 is implemented in software or as instructions hard-coded in gates. In particular, exemplary implementation includes making a comparison between a digital input value (i.e., input 553) representative of the output from controlled oscillator 570 with a threshold value maintained in software or programmed via gates (blocks 555, 559). Where it is determined that the resulting digital code is greater than a determined threshold value (block 559), a "high" output is provided (block 563), otherwise a "low" output is provided (block 565). It should be noted that exemplary implementation 551 provides for a single threshold detection, and that more comparators may be used where additional thresholds are to be detected. Thus, for example, where high and low threshold values are to be detected, two comparisons may be performed. Where it is desired to reduce the incremental change applied to very low pass filter 560, a finer comparison may be performed to create a corresponding decrease in step size. Based on the disclosure provided herein, one of ordinary skill in the art will recognize a variety of digital detection circuits that may be implemented depending upon particular design considerations.

Figure 6:
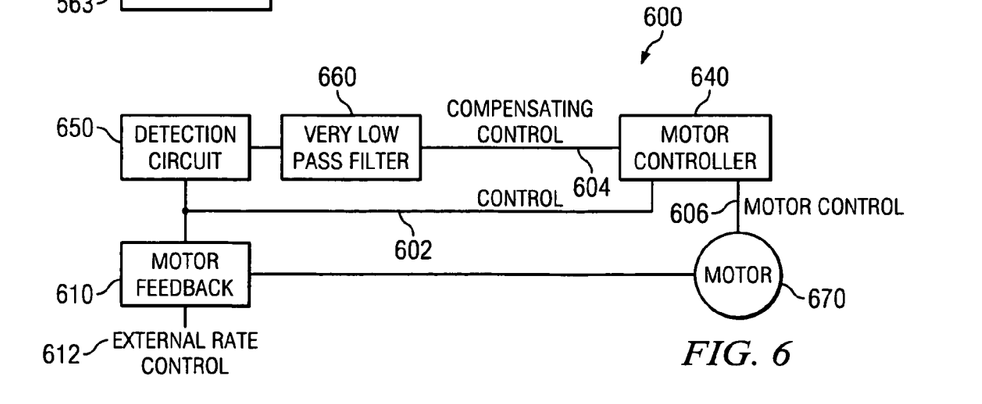
FIG. 6 is a motor control circuit in accordance with some embodiments of the present invention.

Turning to FIG. 6, a motor control system 600 in accordance with yet other embodiments of the present invention is depicted. Motor control system 600 includes a motor feedback circuit 610, a motor 670, a motor controller 640, a detection circuit 650, and a very low pass filter 660. In general, motor feedback 610 compares an operational rate of motor 670 with an external rate control 612. A control signal 602 representing the difference between external rate control 612 and the operational rate of motor 670 is provided to motor controller 640. In turn, motor controller 640 adjusts a motor control signal 606 that causes motor 670 to modify its rate of operation to match that indicated by external rate control 612.

Motor control system further includes a drift compensation circuit including a detection circuit and a very low pass filter 660. In operation, detection circuit 650 detects a drift ongoing in one or more of the components of motor control system 600. Detection circuit 650 operates similar to that described in relation to detection circuit 350 and/or detection circuit 550. When a drift is detected, detection circuit 650 applies compensating control 604 via very low pass filter 660. Compensating control varies as a function of drift detected by detection circuit 650 and operates to adjust the rate of operation of motor 670 to reduce the effects of drift on motor control circuit 600.

In conclusion, the present invention provides novel systems, methods for providing drift compensation in control circuits. While detailed descriptions of one or more embodiments of the invention have been given above, various alternatives, modifications, and equivalents will be apparent to those skilled in the art without varying from the spirit of the invention. Therefore, the above description should not be taken as limiting the scope of the invention, which is defined by the appended claims.

What is claimed is:

1. A system for compensating drift in a control circuit, the system comprising:
   a controlled oscillator;
   a first control signal, wherein the first control signal is provided by a charge pump;
   a detection circuit electrically coupled to the first control signal, wherein the detection circuit is operable to detect a drift in the first control signal; and
   a second control signal provided by the detection circuit, wherein the second control signal varies as a function of the drift in the first control signal;
   and wherein a combination of the first control signal and the second control signal at least in part govern an output frequency of the controlled oscillator.

2. The system of claim 1, wherein the drift is a temperature drift.

3. The system of claim 1, wherein the first control signal is a fine control signal, and wherein the system further includes:
 a coarse control signal;
 and wherein the second control signal is operable to maintain an operation within a range indicated by the fine control signal.

4. The system of claim 3, wherein the controlled oscillator is a voltage controlled oscillator, and wherein the system further includes:
 a very low pass filter, wherein the voltage controlled oscillator provides the output frequency based at least in part on all of the fine control signal, the coarse control signal, and the second control signal; and wherein the second control signal is provided to the voltage controlled oscillator via a very low pass filter.

5. The system of claim 1, wherein the detection circuit is implemented at least partially in the digital domain, and wherein the voltage controlled oscillator is implemented in the analog domain.

6. The system of claim 5, wherein the first control signal is provided to the detection circuit in the digital domain, and provided to the voltage controlled oscillator in the analog domain.

7. The system of claim 1, wherein the system further includes: a motor controller, wherein the motor controller provides a motor control output based at least in part on both the first control signal and the second control signal, and wherein the motor controller is operable to maintain a motor associated with the motor controller within a range indicated by the first control signal.

8. A method for drift compensation, the method comprising:
 providing a control circuit including a charge pump, wherein the control circuit outputs a first control signal;
 monitoring the first control signal, wherein the first control signal is provided to a detection circuit, and wherein a variance is detected in the first control signal; and
 providing a second control signal by the detection circuit, wherein the second control signal varies as a function of the detected variance.

9. The method of claim 8, wherein the control circuit forms part of a phase lock loop circuit, and wherein the method further comprises:
 providing a voltage controlled oscillator; and
 driving a voltage controlled oscillator with both the first control signal and the second control signal.

10. The method of claim 9, wherein monitoring the first control signal is performed in the digital domain, and wherein driving the voltage controlled oscillator with both the first control signal and the second control signal is done in the analog domain.

11. The method of claim 8, wherein the first control signal is a fine control signal, and wherein the control circuit further outputs a coarse control signal.

12. The method of claim 11, wherein the control circuit forms part of a phase lock loop circuit, and wherein the method further comprises:
 providing a voltage controlled oscillator;
 driving a voltage controlled oscillator with all of the fine control signal, the coarse control signal, and the second control signal; and
 wherein a frequency output of the voltage controlled oscillator is maintained within a range indicated by the fine control signal.

13. A phase lock loop circuit, the circuit comprising:
 a controlled oscillator, wherein the controlled oscillator is electrically coupled to at least a first control signal and a second control signal;
 a detection circuit, wherein the detection circuit is electrically coupled to the first control signal and to the second control signal, and wherein the detection circuit is operable to detect a drift in the first control signal and to provide the second control signal that varies as a function of the drift in the first control signal; and
 wherein the first control signal and the second control signal are active at the same time.

14. The circuit of claim 13, wherein the first control signal is a fine control signal, and wherein the system further includes:
 a coarse control signal, wherein the coarse control signal is applied to the controlled oscillator; and
 wherein the second control signal is operable to maintain an output frequency of the controlled oscillator within a range indicated by the fine control signal.

15. The circuit of claim 13, wherein the detection circuit is implemented at least partially in the digital domain, and wherein the controlled oscillator is implemented in the analog domain.

16. The circuit of claim 15, wherein the first control signal is provided to the detection circuit in the digital domain, and wherein the first control signal is provided to the voltage controlled oscillator in the analog domain.

17. The circuit of claim 13, wherein the first control signal and the second control signal are electrically coupled to respective inputs on the controlled oscillator.

18. The circuit of claim 13, wherein the circuit further includes: a motor controller, wherein the motor controller provides a motor control output based at least in part on both the first control signal and the second control signal, and wherein the motor controller is operable to maintain a motor associated with the motor controller within a range indicated by the first control signal.

19. The system of claim 1, wherein the first control signal and the second control signal are active at the same time.

20. The system of claim 3, wherein the fine control signal, the coarse control signal, and the second control signal are all active at the same time.

* * * * *